United States Patent
Yamazaki et al.

[11] Patent Number: 5,975,915
[45] Date of Patent: Nov. 2, 1999

[54] SOCKET FOR INSPECTION OF SEMICONDUCTOR DEVICE

[75] Inventors: Kouichi Yamazaki, Nagano-ken; Hiroto Komatsu, Saitama-ken, both of Japan

[73] Assignee: Shin-Etsu Polymer Co., Ltd., Tokyo, Japan

[21] Appl. No.: 08/987,071

[22] Filed: Dec. 8, 1997

[51] Int. Cl.[6] .................................................. H01R 9/09
[52] U.S. Cl. .............................. 439/72; 439/331; 439/91
[58] Field of Search ............................. 439/72, 73, 331, 439/67, 66, 711, 526, 91

[56] References Cited

U.S. PATENT DOCUMENTS

| | | | |
|---|---|---|---|
| 4,329,642 | 5/1982 | Luthi et al. | 439/71 |
| 4,843,313 | 6/1989 | Walton | 439/73 |
| 5,166,609 | 11/1992 | Cole et al. | 324/158 |
| 5,494,448 | 2/1996 | Johnson et al. | 439/72 |
| 5,584,707 | 12/1996 | Volz et al. | 439/72 |
| 5,626,481 | 5/1997 | Abe | 439/73 |
| 5,631,571 | 5/1997 | Spaziami et al. | 324/752 |
| 5,847,572 | 12/1998 | Iwasaki et al. | 439/91 |

FOREIGN PATENT DOCUMENTS

| 8-096911 | 4/1996 | Japan | H01R 33/76 |
|---|---|---|---|
| 2218932 | 11/1989 | United Kingdom . | |

OTHER PUBLICATIONS

Patent Abstracts of Japan, vol. 97, No. 6, Jun. 30, 1997 & JP 09 035789—(Shin–Etsu Polymer Co. Ltd.) Feb. 7, 1997.
Patent Abstracts of Japan, vol. 96, No. 08, Aug. 30, 1996 & JP 08 096911—(Shin–Etsu Polymer KK) Apr. 12, 1996.
Patent Abstracts of Japan, vol. 97, No. 6, Jun. 30, 1997 & JP 09 033606—(Shin–Etsu Polymer Co. Ltd.) Feb. 7, 1997.
Patent Abstracts of Japan, vol. 97, No. 4, Apr. 30, 1997 & JP 08 335486—(Shin–Etsu Polymer Co. Ltd.) Dec. 17, 1996.
Database WPI—Section EI, Week 9805—Derwent Publications Ltd.—Class S01, AN980049020 & JP 09 298 257 A (Shin–Etsu Polymer KK) Nov. 1997.

*Primary Examiner*—Neil Abrams
*Assistant Examiner*—T C Patel
*Attorney, Agent, or Firm*—McAulay Nissen Goldberg Kiel & Hand, LLP

[57] ABSTRACT

A socket for the inspection of semiconductor devices is disclosed which has laterally extended leads. The device is mounted in a mounting seat of the socket body and results in improvement of the inspection process because difficult steps such as soldering can be omitted. The socket is composed of a socket body which is mountable on a circuit board having a mounting seat therefor, a lead frame intervening between the socket body and the circuit board and an anisotropically electroconductive elastic connector sheet.

6 Claims, 6 Drawing Sheets

SOCKET FOR INSPECTION OF SEMICONDUCTOR DEVICE

BACKGROUND OF THE INVENTION

The present invention relates to a socket for inspection of a semiconductor device or, more particularly, to a socket for inspection of, in particular, a surface-mountable semiconductor package having a plurality of leads on the side surfaces such as QFPs (quad flat packages), SOPs (small outline packages), PLCCs (plastic leaded chip carriers) and LCCs (leadless chip carriers).

In conducting a burn-in test of semiconductor packages, it is conventional to employ an IC socket for electrical connection between the electrode terminals of the semiconductor package and the electrode terminals of the testing circuit board. An IC socket for such a purpose of a known type comprises a socket body provided with a mounting seat to which a semiconductor package is mountable, a plurality of leads or pins fixed to the mounting seat of which the electrode terminals are connected to the side surfaces and bottom surfaces of the socket body with lead wires and a covering member pivotally rotatable up and down to open or close the upper opening of the mounting seat.

While the above mentioned covering member serves, when the covering member is brought into a position to close the upper opening of the mounting seat, to press down the semiconductor package mounted in the mounting seat so as to bring the electrode terminals of the semiconductor package and the leads or pins of the socket appearing inside of the mounting seat into a press-contacting state, it is usual that the covering member is provided on the lower surface thereof with a resilient cushioning member utilizing a rubber pad or spring so as to ensure uniformity of the contacting pressure between the above mentioned contact points. The IC socket of this type is mounted on a circuit board by soldering the leads to the electrode terminals of the circuit board, when the leads are provided on the side surfaces of the socket body, or by inserting the pins through the through-holes in the circuit board, when pins are provided on the bottom surface of the socket body.

The above described conventional IC socket has disadvantages that, since a plurality of electrode terminals must be provided on the mounting seat of the socket body and a plurality of leads or pins must be provided on the outer surface of the socket body, the number of necessary parts is so large and the assembling work is accordingly very troublesome.

Conventional IC sockets of this type have problems that soldering is always involved in the assembling work on a circuit board so that the number of process steps is increased so many and, in particular, when pins are to be provided, through-holes must be formed in the circuit board so that the design of the circuit board is complicated correspondingly.

SUMMARY OF THE INVENTION

The present invention has an object, in view of the above described problems in the prior art sockets, to provide an improved socket for inspection of semiconductor devices having a simple structure to be assembled from a relatively small number of parts as well as excellent high-frequency characteristics and capable of giving a great freedom to the design of circuit boards.

Thus, the present invention provides a socket for inspection of a semiconductor device or, in particular, for inspection of a semiconductor device having leads or electrode terminals on the outer surface of the body of the device by electrically connecting the leads or electrode terminals to the electrode terminals of a circuit board, which comprises:

(a) a socket body mountable on the circuit board by positioning having a mounting seat for the body of the semiconductor device in a freely demountable fashion;

(b) a lead frame intervening between the socket body and the circuit board having contacting shoes extended out of the surface facing the circuit board in the mounting seat of the socket body, the contacting shoes being brought into contact, when the semiconductor device is mounted on the mounting seat, with the leads or electrode terminals of the semiconductor device; and (c) an anisotropically electroconductive elastic connector sheet interposed between the lead frame and the circuit board to be in contact with the electrode terminals of the circuit board on one surface and with the contacting points of the contacting shoes of the lead frame on the other surface.

In particular, the above mentioned anisotropically electroconductive elastic connector sheet is a sheet body consisting of a matrix of a rubbery elastomer sheet and a multiplicity of electroconductive filamentous bodies embedded in parallel each to the others in and penetrating the matrix sheet from one surface to the other. Preferably, the rubbery elastomer has a hardness of 20° H to 60° H according to JIS K 6301 for the type A rubber hardness and the metallic filament has a volume resistivity not exceeding $10^{-1}$ ohm.cm and has a diameter in the range from 20 to 90 $\mu$m. These metallic filaments are embedded in the insulating matrix sheet keeping a distance of 10 to 125 $\mu$m each from the adjacent ones and each filament penetrates the matrix sheet in an inclined direction with an offset within the plane of the sheet not exceeding a half of the thickness of the matrix sheet.

Further, the above mentioned lead frame is a flexible circuit board made from a base film of an insulating resin having patterning on one surface.

The above mentioned contacting shoes of the lead frame are each formed from a metallic material having resilience such as phosphor bronze and beryllium copper and capable of being resiliently bent in an arched configuration inside of the mounting seat.

Though optional, the contacting point of the contacting shoe of the lead frame has a roughened surface or sharpened points so as to be able to scratch off a surface film on the contacting surface.

DETAILED DESCRIPTION OF THE PREFERRED EMBODIMENTS

As is described above, the socket for inspection of semiconductor devices provided by the invention comprises, as the essential parts, a socket body as the element (a), a lead frame as the element (b) and an elastic connector sheet as the element (c) intervening between the elements (a) and (b). The inventive socket is suitable for inspection of various types of semiconductor packages such as QFPs, SOPs, PLCCs and LCCs, in particular, having leads or electrode terminals on the side surfaces of the device body.

In the following, each element of the inventive socket is described in detail by making reference to the accompanying drawing, where necessary.

The socket body 30 serves to mount a semiconductor device with exact positioning and is employed by repeating mounting and demounting of semiconductor devices 10 so many times that the socket body 30 should have high durability both in the material and in the design. The socket body 30 is formed from a synthetic resin having good surface lubricity and capable of withstanding hard working environmental conditions within a temperature range from −60 to +150° C. such as epoxy resins, acrylic resins, polyester resins, polyphenylene sulfide resins, polyether sulfone resins and polyether imide resins. The socket body can be shaped by injection molding of these resins or by mechanical working of a resin block. Since the socket body 30 is mounted on a circuit board with exact positioning, it is preferable that the socket body 30 is provided with a positioning means such as positioning pins 33, by means of which the socket body 30 is freely mountable on and demountable from the circuit board 20. The mounting seat 31 of the socket body 30 is an openwork or cavity having a form and dimensions just to fit the molded part or mounting substrate of the body 11 of the semiconductor package 10, if necessary, with a positioning means for the semiconductor package.

The socket body 30 is accompanied, if necessary, by a presser member 60 and a covering member 70. The presser member 60 has such a structure as to press and urge the semiconductor package 10 or the leads thereof in such a direction as to establish contacting of the leads 12 and the contacting shoes 42 of the lead frame 40 by means of its body weight per se or by means of separately provided spring or rubber members. The covering member 70 has such a structure as to be pivotally rotatable around a hinge along a side line of the socket body 30 and to be fixedly engageable with the socket body 30 or, when the covering member 70 is separable from the socket body 30, as to be fixedly engageable with the socket body 30 with claws. The covering member 70 can be shaped from the same synthetic resin as that for the socket body 30. The covering body 70 is assembled to the socket body 30 by means of a resilient means such as a spring in such a fashion as to be able to directly press down the semiconductor package 10, to indirectly press down the semiconductor package 10 by means of a rubber pad bonded to the lower surface of the covering member 70 or to press down the semiconductor package from above the covering member 70 so that the leads 12 of the semiconductor package 10 and the contacting shoes 42 of the lead frame 40 are brought into a contacting condition under an appropriate contacting load.

The lead frame 40 is formed from a base sheet or plate of a synthetic resin, on one surface of which a plurality of contacting shoes 42 are formed to be exposed. The contacting shoes 42 are extended into the mounting seat 31 of the socket body 30, preferably, in an archwise bent form. As a particular embodiment, the lead frame 40 can be a flexible board having contacting shoes 42 of a metal of good electric conductivity such as copper integrally patterned on one surface of a base sheet of a synthetic resin. The lead frame 40 can be shaped from the same synthetic resins as the socket body 30 since the requirements therefor are approximately identical with those for the socket body 30. The contacting shoes 42 of the lead frame 40 each have a dimensions of, for example, 0.15 mm thickness and 0.2 mm width and shaped from a resilient metallic material suitable for springs such as phosphor bronze and beryllium copper.

Though optional, an electroconductive layer 43 is formed on the surface of the base sheet of the lead frame 40 opposite to the contacting shoes 42 and the electroconductive layer 43 is grounded so as to exhibit an effect of shielding against external electromagnetic waves. Further, the electroconductive layer 43 is connected to the power source line via a chip capacitor so as to reduce the influences by the fluctuation of the power source voltage and to facilitate setting of the impedance. As a particular embodiment, the impedance of the lead frame 40 is set at about 50 ohm relative to the high frequency signals for inspection. The contacting shoes 42 are preferably provided with a plating layer of gold or silver. For example, an underplating layer of nickel having a thickness of 0.5 to 3 $\mu$m is first formed on the contacting shoes 42 followed by overplating of gold in a thickness of 0.05 to 5 $\mu$m. Further, the contacting surface of the contacting shoes 42 is roughened by sandblasting or provided with sharp-pointed protrusions so that the oxidized surface film on the leads 12 of the semiconductor package 10 can be broken by scratching with this surface film breaking means.

The anisotropically electroconductive elastic connector sheet 50 is a composite body consisting of a matrix sheet 51 of a polymeric material having elasticity such as silicone rubbers, elastic thermosetting resins, e.g., epoxy resins, synthetic rubbers and thermoplastic resins, e.g., polyethylene resins, polyurethane resins, ABS resins and plasticized polyvinyl chloride resins, and fine metallic filaments 52 embedded in parallel each to the others in the matrix sheet 51 penetrating the matrix sheet 51t from one surface to the other.

The matrix sheet 51 has a thickness in the range from 0.3 to 2.0 mm and a volume resistivity of at least $10^{12}$ ohm·cm. The elastic polymer forming the matrix sheet 51 of the connector 50 has a type A hardness in the range from 20 to 60° H or, preferably, from 30 to 60° H specified in JIS K 6301. The fine metallic filament 52 has a diameter in the range from 20 to 90 $\mu$m or, preferably, from 20 to 70 $\mu$m and the metallic material forming the filaments 52 should have a volume resistivity not increasing $10^{-1}$ ohm·cm. The distribution density of the metallic filaments 52 embedded in parallel in the matrix sheet 51 is in the range from 70 to 1000 filaments or, preferably, from 100 to 1000 filaments per mm$^2$ of the surface area of the matrix sheet 51 keeping a distance of 10 to 125 $\mu$m each from the adjacent filaments. The end portions of each of the metallic filaments 52 should be protruded out of the surface of the matrix sheet 51 by 5 to 50 μm or, preferably, by 5 to 30 μm. Further, each of the metallic filaments 52 has a running direction perpendicular to the surface of the matrix sheet 51 but can be inclined with an offset x (see FIG. 7) within the plane of the sheet surface not exceeding a half of the thickness of the matrix sheet 51.

As is described above, the inventive socket for inspection of semiconductor devices comprises a socket body 30 and a lead frame 40 mounted on a circuit board 20 with exact positioning by means of positioning pins 33 and the like with intervention of an anisotropically electroconductive elastic connector sheet 50 between the contacting shoes 42 of the lead frame 40 and the electrode terminals 21 on the circuit board. Accordingly, the socket has a simple structure consisting of a small number of parts and can be assembled without necessitating soldering or other troublesome means and further, through-holes or other openworks need not be formed in the circuit board 20 so as to afford a large freedom in the design of the circuit board 20.

In conducting inspection of a semiconductor package 10 by using the socket of the invention, the semiconductor package 10 is mounted on the mounting seat 31 of the socket body 30 by exact positioning so that the electrode terminals or leads 12 of the semiconductor package 10 are brought into electric conduction by contacting with the contacting shoes 42 of the lead frame 40 while the contacting shoes 42 are electrically connected to the electrode terminals 21 on the circuit board 20 through the elastic connector sheet 50. Namely, each electrode terminal 12 of the semiconductor package 10 is in contact with the contacting shoe 42 of the lead frame 40 with resilience to cause arch-wise bending of the contacting shoe 42 to establish electric conduction between the electrode terminals 12 of the semiconductor package 10 and the contacting shoes 42 of the lead frame 40 which in turn is in electric conduction with the metallic filaments 52 of the connector sheet 50 which are in contact with the electrode terminals 21 on the circuit board 20. It is noted that, when the running direction of the metallic filaments 52 in the matrix sheet 51 of the connector sheet 50 is not perpendicular to the surface of the sheet but is inclined by an offset x, the position of the electrode terminals 12 of the semiconductor package 10 and the position of the electrode terminals 21 on the circuit board 20 are displaced each from the other by a distance corresponding to the offset x.

In an embodiment in which the lead frame 40 is in the form of a flexible circuit board, the lead frame 40 can be designed by utilizing the versatile designing rules undertaken for flexible circuit boards so that excellent high frequency characteristics can be accomplished.

Advantages are obtained by using contacting shoes 42 of the lead frame 40 made from a resilient copper-based alloy that very reliable electric conduction can be obtained between the contacting shoes 42 and the leads 12 of the semiconductor package 10 along with excellent durability.

When each contacting shoe 42 of the lead frame 40 is provided on the contacting point thereof with a surface film-breaking means mentioned above, the electric conduction between the contacting shoes 42 and the leads of the semiconductor package 10 can be more reliable because, even when the contacting surface of the leads 12 is covered with an oxidized surface film, the surface film can be efficiently destroyed or removed.

Further, the above described requirements for the anisotropically electroconductive elastic connector sheet 50 are important in order to ensure reliable electric conduction between the electrode terminals 12 of the semiconductor package 10 and the lead frame 40 in relation to an adequate elasticity of the sheet 50 and excellent durability. In addition, a possibility of an advantage can be obtained that, when two or more terminal electrodes 21 on the circuit board 20 could be connected to a single contacting shoe 42 of the lead frame by using a suitable connector sheet 50, inspection of the semiconductor package 10 could be performed by utilizing testing signals of different modes through different sets of the electrode terminals 21 on the circuit board 20 successively so that the efficiency of the inspection process can be greatly improved.

In the following, the socket of the invention for inspection of a semiconductor device is described in more detail by making reference particularly to the accompanying drawing.

Figure 1:
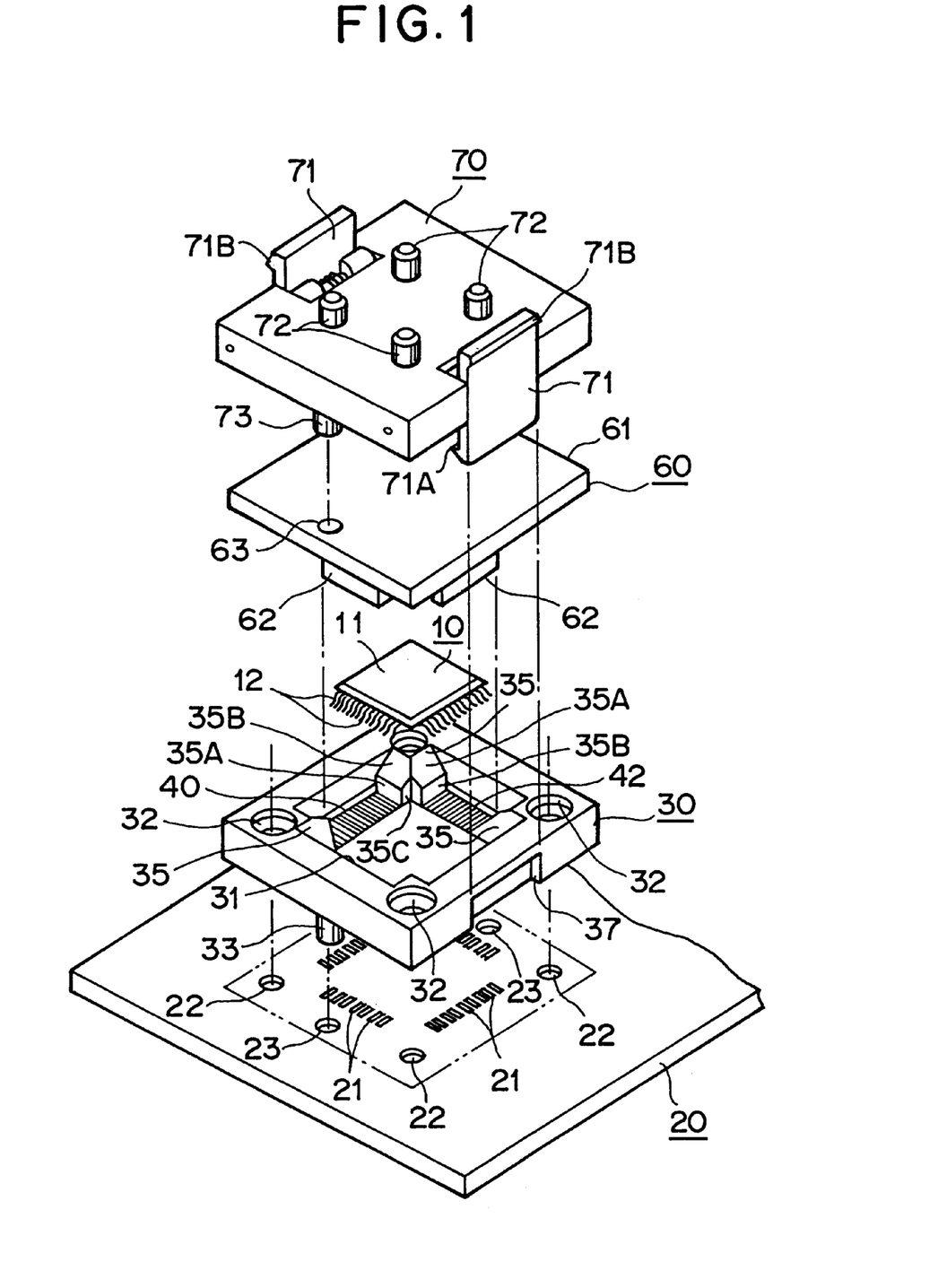
FIG. 1 is a perspective view of the inventive socket for inspection of semiconductor devices as disassembled into parts, a semiconductor package and a circuit board being added.

FIG. 1 is a perspective view of the inventive socket consisting of a socket body 30, lead frame 40 and connector sheet (not shown in this figure) as disassembled into parts with addition of a circuit board 20, semiconductor package 10 of the QFP type having a square plan, a covering member 70 and a presser member 60 intervening between the semiconductor package 10 and the covering member 70. As is usual, the semiconductor package 10 has a molded body 11 in the form of a square plate and arrays of a plurality of leads 12 extended out of the four side surfaces of the molded body 11 as arranged at a regular pitch. Each of the leads 12 has a configuration bent something like an arch.

The circuit board 20 is provided on the surface with groups of electrode terminals 21 at a regular pitch along the four side lines of the square or rectangular area corresponding to the openwork 31 of the socket body 30 to serve as the mounting seat 31 to receive the semiconductor package 10. The circuit board 20 is provided with mounting holes 22 in the vicinity to each of the corners within the square or rectangular area and also with two positioning holes 23 in the vicinities of about the center points of the opposite two side lines of the above mentioned square or rectangular area. As is described later, each of the mounting holes 22 corresponds to one of the mounting holes 32 in the socket body 30 so that the socket body 30 and the circuit board 20 can be fastened together by means of bolts and nuts (not shown in the figure) for the sets of the mounting holes 22 and 32. The positioning holes 23 correspond to the positioning pins 33 on the lower surface of the socket body 30, each of which is inserted into the corresponding positioning holes 23.

Figure 2:
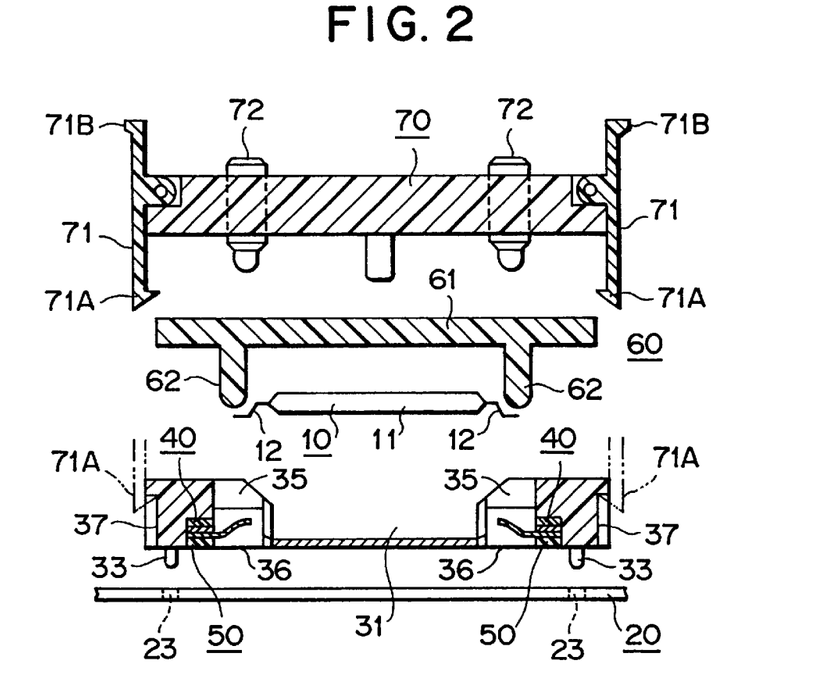
FIG. 2 is a vertical cross sectional view of the inventive socket for inspection of semiconductor devices as disassembled into parts.

The socket body 30, which is in a square or rectangular form, is shaped by injection molding or from a block of a resin such as an epoxy resin, acrylic resin, polyester resin, polyphenylene sulfide resin, polyether sulfone resin or polyether imide resin by machining. The socket body 30 has an openwork or upwardly opening cavity to serve as a mounting seat 31 for a semiconductor package 10 and, on the lower surface, provided with mounting cavities 39 (see FIG. 4) along the four side lines of the square or rectangular area opposite to the mounting seat 31. Each of these mounting cavities 39 serves for positioned mounting of the lead frame 40 and the elastic connector sheet 50 by screwing. The mounting seat 31 is also in a square or rectangular form corresponding to the molded body 11 of the semiconductor package 10 which can be inserted into and demounted from the mounting seat 31. A positioning bank 35 is provided at each corner of the mounting seat 31 to facilitate exact and rapid mounting of the semiconductor package 10 to the mounting seat 31 while a connecting cavity 36 is formed on the lower surface of the positioning bank 35 (see FIG. 2).

Figure 3:
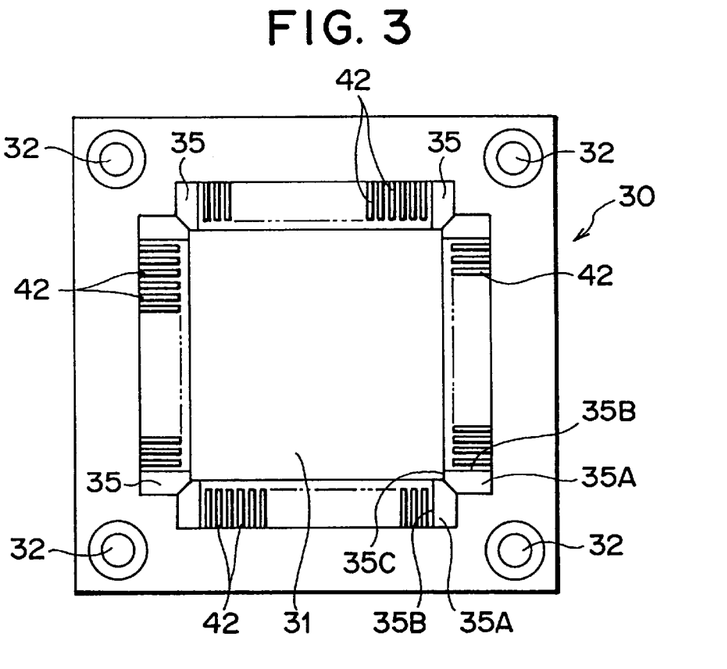
FIG. 3 is a plan view of the socket body.

Each of the positioning banks 35 has inclined facets 35A to face the positioning bank 35 at the next corner of the mounting seat 31 and vertical facets 35B in parallel to the vertical facet 35B of the positioning bank 35 at the next corner as well as a positioning notch 35C having a right-angled plan view. Each of the inclined facets 35A is so inclined as to guide the leads 12 of the semiconductor package 10 mounted in the mounting seat 31 onto the connecting cavity 36. The distance between two oppositely facing vertical facets 35B at the adjacent corners is approximately equal to the length of an array of leads 12 on one side surface of the semiconductor package 10 to define the position of the leads 12 above the connecting cavity 36. The distance between the diagonally facing positioning notches 35C is approximately equal to the diagonal length of the molded body 11 of the semiconductor package 10 to serve for positioning of the molded body 11.

The socket body 30 is provided with positioning pins 33 each on the bottom surface facing the circuit board 20 implanted at a position in the vicinity of one of the opposite side peripheries of the body 30 while a notched recess 37 is formed on one of the other side surfaces to serve for engagement and a mounting through-hole 32 is formed in the vicinity of each of the four corners of the socket body 30. Each of the positioning pins 33 is, when the socket body 30 is mounted on the circuit board 20, inserted into and fixed to one of the positioning holes 23 in the circuit board 20 while the mounting hole 32 in the socket body 30 and the mounting hole 22 in the circuit board 20 are penetrated together with a bolt and fastened by means of a nut (not shown in the figures). After mounting the semiconductor package 10 in the mounting seat 31 of the socket body 30, a presser member 60 is mounted on the semiconductor package 10 and further a covering member 70 is put thereon which is fastened to the socket body 30 by means of engagement of the engagement claws 71 with the engagement recess 37 in the socket body 30.

Figure 4:
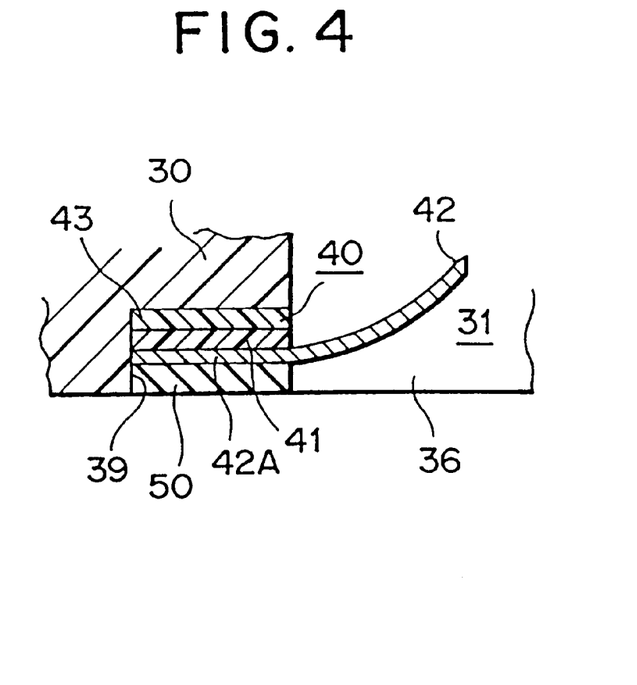
FIG. 4 is an enlarged schematic partial cross sectional view of the inventive socket for inspection of semiconductor devices.

As is illustrated in FIG. 4, the lead frame 40 has a structure in which a plurality of contacting shoes 42 are bonded at regular intervals of alignment onto the lower surface of a base film 41 of an insulating resin such as polyimide resins and polyester resins while the upper surface of the insulating resin film 41 is covered with an electroconductive layer 43 of, for example, a copper foil which is electrically grounded. Each of the contacting shoes 42 is bonded to the base film 41 on the contacting point 42A while the other end of the contacting shoe is extended in a cantilever fashion to form a combteeth-like arrangement and bent in an arch-wise configuration. The electroconductive layer 43 is connected to the electric power source line via a chip capacitor in order to reduce the influences caused by fluctuation of the source voltage. The lead frame 40 can be prepared by a known method conventional in the manufacture of printed circuit boards by utilizing, for example, the techniques of patterning.

Figure 5:
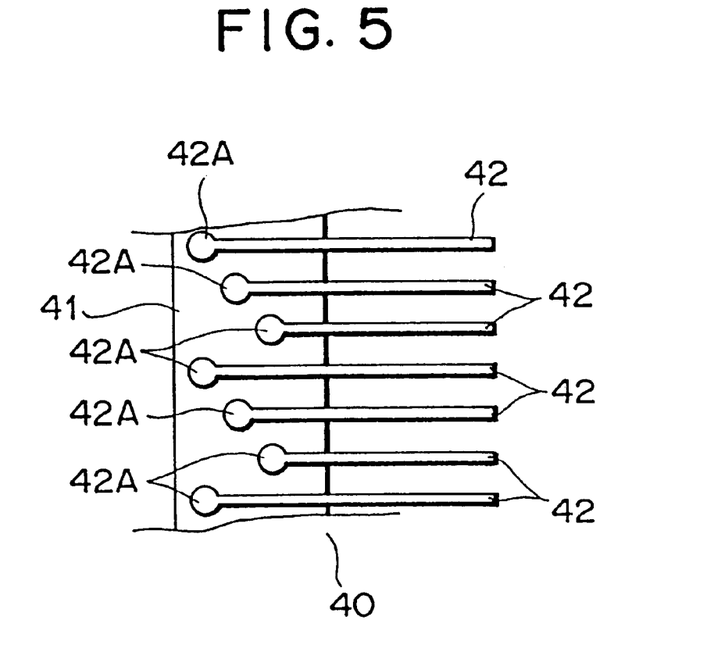
FIG. 5 is a partial bottom plan view of the lead frame of the inventive socket for inspection of semiconductor devices.

The contacting shoe 42 is a resilient spring member made of a fine ribbon of, for example, 0.2 mm width and 0.15 mm thickness made from a resilient metallic material such as phosphor bronze and beryllium copper. The end portion opposite to the contacting point 42A, at which the contacting shoe 42 is bonded to the lower surface of the base film 41, is extended above the contacting hole 36 in an elastically bendable fashion. As is illustrated in FIG. 5 by a plan view, the end portion of the contacting point 42A of each contacting shoe 42 is formed to have a circular contour having a diameter larger than the width of the shoe body per se to ensure good bonding strength to the base film 41 and reliable electric connection while these circular end portions of the contacting shoes 42 are arranged in a zigzag or staggering arrangement with an object to enable a finer arrangement pitch.

Figure 6A:
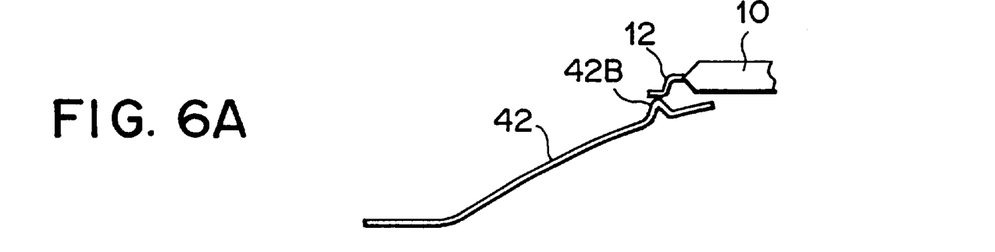
FIGS. 6A to 6E are each an enlarged partial cross sectional view of the lead frame of a different embodiment in the inventive socket for inspection of semiconductor devices.
Figure 6B:
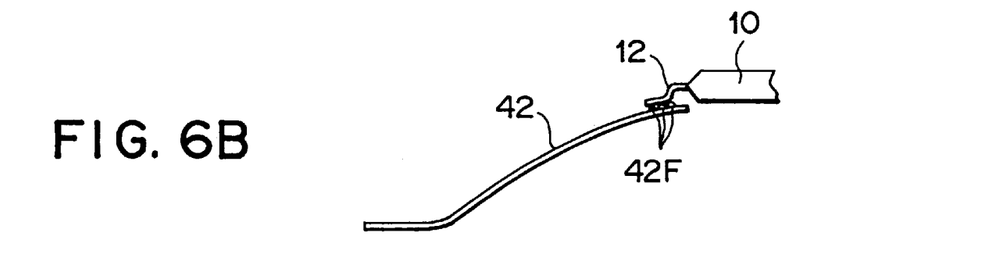
Figure 6C:
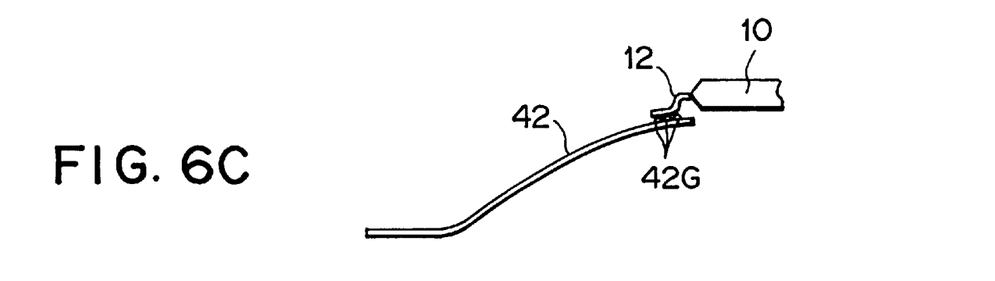

Since the cantilever-like extended end of the contacting shoe 42 is contacted with one of the leads 12 of the semiconductor package 10, as is illustrated in FIG. 6A, it is advantageous, though not essential, to form a sharp contacting point 42B at or near the extended end which serves as a surface film-breaking point to break the oxidized surface film on the surface of the lead 12 by scratching to ensure good electric conduction therebetween even when the surface of the lead 12 is covered with an insulating oxidized film. The contacting shoe 42 preferably has such a resilience that, when a load of 30 gf is applied to the end point thereof, the resilient displacement of the end point is in the range from 0.3 to 0.5 mm.

Figure 6D:
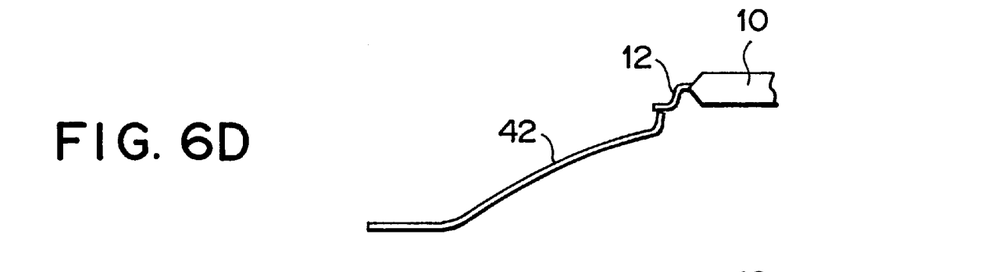
Figure 6E:
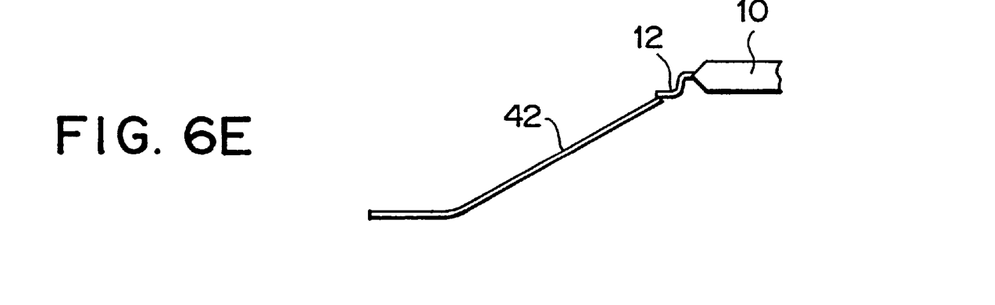

FIGS. 6B to 6E are each an illustration of an alternative embodiment relative to the contacting condition between the contacting shoe 42 and the lead 12 of the semiconductor package 10. In the embodiment illustrated in FIG. 6B, rivet head-like semispherical protrusions 42F are provided on the contacting surface of the contacting shoe 42 or the protrusions can be conical or pyramidal protrusions 42G with a sharp apex point illustrated in FIG. 6C. Further, as is illustrated in FIGS. 6D and 6E, the contacting shoe 42 can be contacted with the lead 12 at the sharply edged ends formed by cutting. It is of course effective that the contacting shoe 42 has a contacting surface roughened by sandblasting where the contacting shoe is contacted with the lead 12 of the semiconductor package 10.

Though optional, furthermore, it is advantageous to have the contacting shoes 42 provided with a plating layer of a precious metal such as gold at least on the contacting surface with the leads 12 of the semiconductor package 10 with an object to ensure high corrosion resistance and low contact resistance for reliable electric conduction therebetween. The gold plating layer having a thickness of 0.03 to 1.0 $\mu$m, e.g., 0.5 $\mu$m, is formed usually on an underplating layer of nickel having a thickness of 2 to 6 $\mu$m, e.g., 3 $\mu$m.

Figure 7:
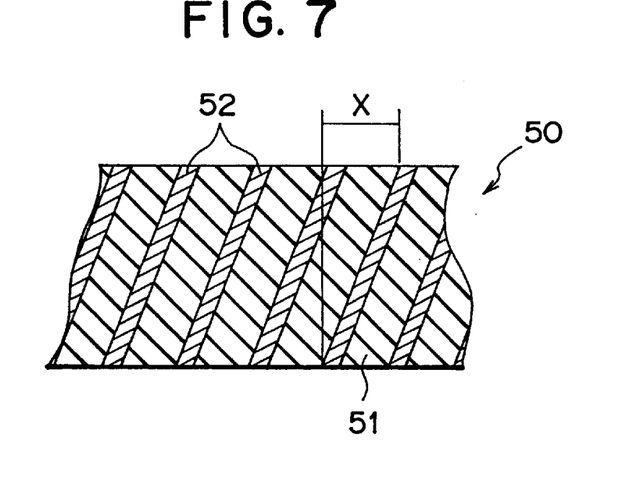
FIG. 7 is a schematic partial cross sectional view of the elastic connector sheet in the inventive socket for inspection of semiconductor devices.

Following is a description of the elastic connector sheet 50 to be interposed between the socket body 30 or lead frame 40 and the circuit board 20. As is illustrated in FIG. 7 by a partial cross sectional view, the elastic connector sheet 50 consists of an insulating matrix sheet 51 made from a rubber and a multiplicity of fine filaments 52 of a metallic material embedded in parallel each to the others in the insulating matrix sheet 51 in such a fashion that both end points of each filament are exposed on or protruded out of the respective surfaces of the matrix sheet 51 so that, when the connector sheet 50 is sandwiched between two electrode terminals under a moderate compressive load, the electrode terminals are electrically connected through the conductive filaments 52 of the connector sheet 50 running in the direction approximately in parallel to the thickness of the connector sheet 50. In the inventive socket for inspection, the elastic connector sheet 50 is put into the mounting cavity or groove 39 of the socket body 30 and bonded by using an adhesive so that the connector sheet 50 is contacted, on one surface, with the array of the contacting points 42A of the lead frame 40 and, on the other surface, with the electrode terminals 21 on the circuit board 20.

The insulating matrix sheet 51 of the connector sheet 50 has a thickness of, for example, 0.3 to 2.0 mm and the rubbery material forming the matrix sheet 51 should have a volume resistivity of at least $10^{12}$ ohm·cm and a rubber hardness of 20° H to 60° H or, preferably, 30° H to 60° H according to JIS K 6301 for the type A hardness. The rubbery material forming the matrix sheet 51 is selected, though not particularly limitative, from heat-curable rubbery polymers such as silicone rubbers, epoxy rubbers and other synthetic rubbers and thermoplastic resins having elasticity such as polyethylene resins, polyurethane resins, ABS resins and plasticized polyvinyl chloride resins, of which silicone rubbers are preferred in respect of their high durability to withstand adverse environmental conditions and heat resistance as well as excellent electrical properties.

The metallic fine filaments 52 should have a diameter in the range from 20 to 90 $\mu$m or, preferably, from 20 to 70 $\mu$m and made from a metallic material having a volume resistivity not exceeding 0.1 ohm·cm such as pure gold, gold-based alloys, solder alloys, copper and copper-based alloys, if desired, having a plating layer of gold or a solder alloy. The embedding density of the metallic filaments 52 in the insulating matrix sheet 51 is usually in the range from 70 to 1000 filaments per mm$^2$ or, preferably, from 70 to 1000 filaments per mm$^2$, each filament keeping a distance of 10 to 125 $\mu$m or, preferably, 50 to 100 $\mu$m from the adjacent ones. The running direction of each metallic filament 52 is basically perpendicular to the surface plane of the matrix sheet 51 but can be inclined, as is illustrated in FIG. 7, in such an angle that the offset value x between the two end points of the filament 52 within the plane of the surface of the matrix sheet 51 does not exceed a half of the thickness of the matrix sheet 51.

Figure 8A:
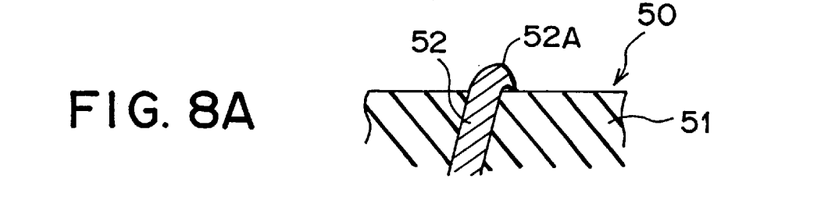
FIGS. 8A to 8C are each a schematic partial cross sectional view of the elastic connector sheet of a different embodiment in the inventive socket for inspection of semiconductor devices.
Figure 8B:
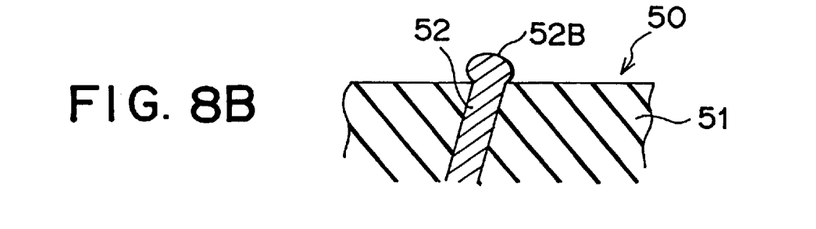
Figure 8C:
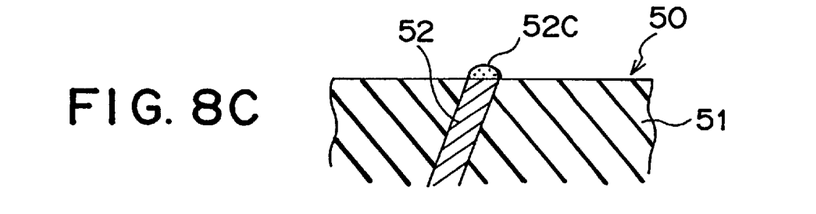

FIGS. 8A, 8B and 8C are each an illustration of a different embodiment of the connector sheet 50 relative to the modification of the end points of the metallic filament 52 by a vertical cross sectional view. FIG. 8A illustrates an embodiment in which the end portion of the filament 52 is cut as bent to form a sharp cutoff end 52A which has an effect to break the oxidized surface film on the electrode terminals with which the end point 52A is brought into contact so as to ensure reliable electric connection therebetween.

In the embodiment illustrated in FIG. 8B, the end portion of the filament 52 is shaped in a configuration of a ball point 52B having a diameter larger than the diameter of the filament 52 per se while, in the embodiment illustrated in FIG. 8C, a semispherical bump 52C is built up on the end surface of the filament 52 by the techniques of gold plating. The connector sheets 50 illustrated in FIGS. 8A to 8C are advantageous in respect of the improved reliability of the electric connection to be established between the surface of the electrode terminals and the metallic filament 52.

The presser member 60 (see FIG. 1) consists of a square or rectangular rigid board 61 which is provided on the lower surface to face the semiconductor package 10 with four pressing bars 62 each along one of the side lines of the board 61 at a position to correspond to one of the arrays of leads 12 of the semiconductor package 10. The board 61 and the pressing bars 62 can be shaped integrally by molding the same synthetic resin as the socket body 30. The presser member 60 is mounted on the semiconductor package 10 in the mounting seat 31 of the socket body 30 in such a fashion that each of the four pressing bars 62 is contacted with one of the arrays of the leads 12 so as to press down the leads 12 against the contacting shoes 42 of the lead frame 40. The presser board 61 is provided with guide holes 63 which, when the covering member 70 is mounted on the presser member 60, guide the guide pins 73 of the covering member 70 inserted thereinto in a freely slidable fashion.

The covering member 70 is also in the form of a square or rectangular board and provided with two engagement claws 71 on the opposite sides of the board. The engagement claw 71 is pivotally supported at about the middle height by means of supporting pins (not shown in the figure) within the notched recess on the side surface of the square or rectangular board in a freely rotatable fashion. The engagement claw 71 has an inwardly protruded claw edge 71A along the lower end line and, when the covering member 70 is mounted on the socket body 30 with the semiconductor package 10 and the presser member 60 interposed therebetween, the claw edge 71A comes into engagement with the notched recess 37 of the socket body 30 as being urged against the socket body 30 by means of a torsion spring (not shown in the figure) provided around one of the supporting pins so that the covering member 70 and the socket body 30 are fastened together holding the semiconductor package 10 and the presser member 60 under an appropriate pressing load. The engagement claw 71 is provided along the upper periphery with a protruded rib 71B which serves as an antiskid member to facilitate finger manipulation for disengagement.

The covering member 70 is further provided with four spring pins 72 each penetrating the board by screwing into an opening in such a fashion that the length of protrusion out of the lower surface of the board is adjustable. Two guide pins 73 are implanted to be protruded out of the lower surface of the board each along one of the opposite side lines of the board at a position corresponding to the guide opening 63 in the presser member 60.

The spring pin 73 has a structure consisting of a shell body with a hexagonal opening to be thrusted into the board of the covering member 70 by screwing and a plunger encased in the shell body and urged downwardly by means of a spring. When the covering member 70 is mounted on the presser member 60, the plungers protruded out of the lower surface of the covering member 70 come into contact with the upper surface of the presser member 60 while the contacting pressure therebetween can be adequately controlled by turning the shell body by using a suitable tool such as a wrench.

The guide pins 73 are made, preferably, from a metallic material. As protruded out of the lower surface of the covering member 70 at symmetrical positions corresponding to the guide holes 63 in the presser member 60, each of the guide pins 73 penetrates the guide hole 63 when the covering member 70 is mounted on the presser member 60 to secure exact up and down movement of the presser member 60.

Incidentally, the covering member 70 is not an essential part of the inventive socket for inspection of semiconductor packages provided that an appropriate contacting load can be ensured between the leads 12 of the semiconductor package 10 and the contacting shoes 42 of the lead frame 40. Namely, a good contacting condition can be obtained with about 30 gf of the contacting load per a single pair of one of the leads 12 and one of the contacting shoes 42 so that a sufficient contacting load can be obtained, for example, by adequately selecting the body weight of the presser member 60 enabling omission of the covering member 70.

In mounting the inventive socket onto the circuit board 20, firstly, the lead frame 40 is mounted to the socket body 30 with exact positioning along with mounting of the elastic connector sheet 50. Namely, the lead frame 40 is mounted so as to have the contacting shoes 42 extended above the contacting opening 36 of the socket body 30. The contacting points 42A of the contacting shoes 42 are brought into contact with a surface of the elastic connector sheet 50. In the next place, the positioning pins 33 of the socket body 30 are inserted to the respective positioning holes 22 of the circuit board 20 and the socket body 30 and the circuit board 20 are fastened together by means of bolts each penetrating the mounting hole 32 of the socket body 30 and the mounting hole 22 of the circuit board 20. Thus, assemblage of the socket body 30 and the circuit board 20 can be conducted absolutely without soldering. Further, the lead frame 40 and elastic connector sheet 50, when degraded or damaged, can be easily demounted from the circuit board 20 without leaving any contamination by soldering so that the circuit board 20 can be repeatedly used.

The burn-in test of a semiconductor package 10 can be performed with the inventive socket very conveniently by mounting the semiconductor package 10 in the mounting seat 31 of the socket body 30 which can be secured at the position by means of the presser member 60 and the covering member 70 mounted thereon and fastened together so as to ensure an appropriate contacting load of about 30 g between a pair of one of the leads 12 and one of the contacting shoes 42 consequently to establish reliable electric connection between the leads 12 of the semiconductor package 10 and the electrode terminals 21 on the circuit board 20.

Figure 9:
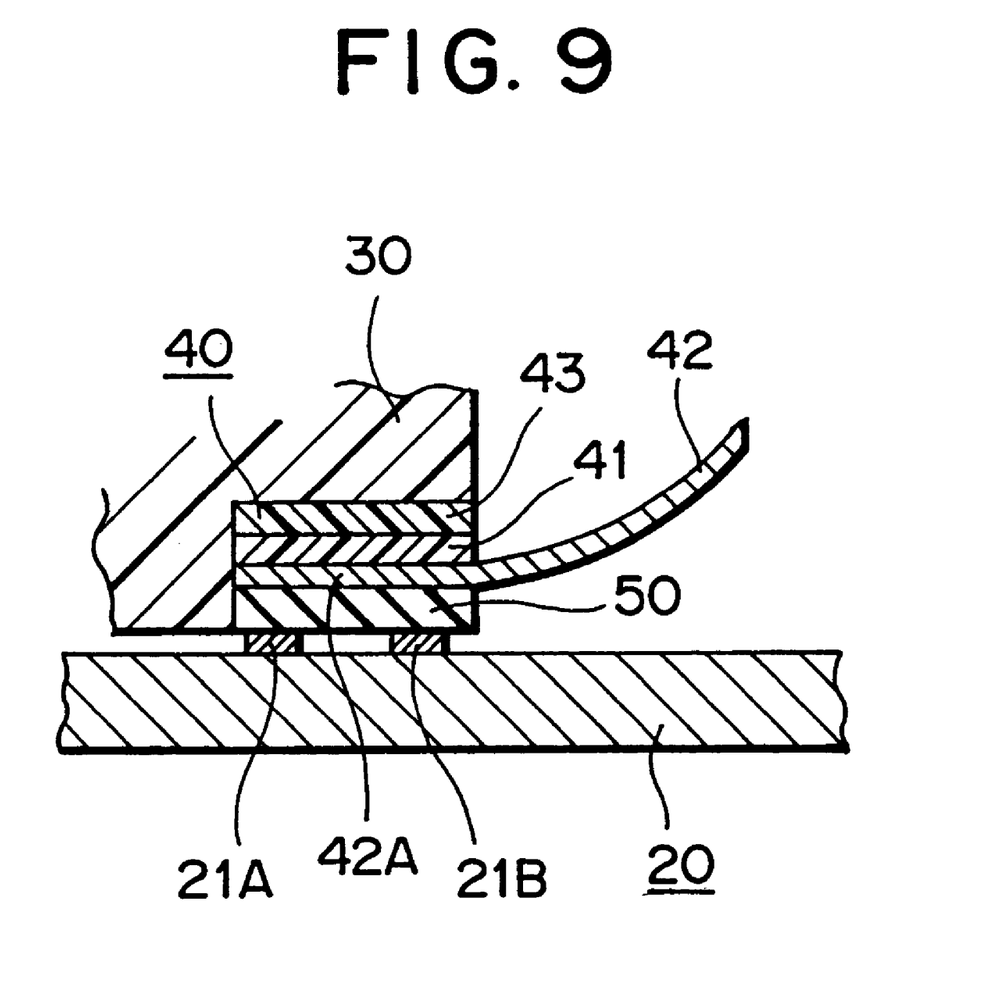
FIG. 9 is an enlarged schematic partial cross sectional view of a modified embodiment of the inventive socket for inspection of semiconductor devices.

FIG. 9 is for illustration of a modified embodiment of the inventive socket as mounted on a circuit board 20 by a partial enlarged vertical cross sectional view. In this embodiment, the circuit board 20 is provided with two sets of electrode terminals 21A and 21B of which each set serves for a different testing mode from the other set and one of the first set terminals 21A and one of the second set terminals 21B are simultaneously contacted with a single contacting shoe 42 with intervention of an elastic connector sheet 50 so that the semiconductor package can be subjected to the inspection tests of two different testing modes by switching the working set of the terminals from 21A to 21B.

What is claimed is:

1. A socket for inspection of a semiconductor device having leads on an outer surface of the semiconductor device by electrically connecting the leads to electrode terminals of a circuit board for inspection, the socket for inspection comprising:

(a) a socket body mountable on the circuit board by positioning, the socket body having a mounting seat for mounting the body of the semiconductor device in a freely demountable fashion;

(b) a lead frame intervening between the socket body and the circuit board and having contacting shoes extended in an arch-wise bent form out of a surface facing the circuit board in the mounting seat of the socket body, the contacting shoes having a precious metal plated contacting surface which is brought into contact, when the semiconductor device is mounted on the mounting seat, with the leads of the semiconductor device; and (c) an anisotropically electroconductive elastic connector sheet interposed between the lead frame and the circuit board to be in contact with the electrode terminals of the circuit board on one surface and with contacting points of the contacting shoes of the lead frame on the other surface wherein the anisotropically electroconductive elastic connector sheet is a sheet member consisting of a matrix of an electrically insulating rubbery elastomer and a multiplicity of electroconductive filamentous bodies embedded in parallel each to the others in the sheet and penetrating the matrix from one surface to the other.

2. The socket for inspection of a semiconductor device as claimed in claim 1 in which the electrically insulating rubbery elastomer forming the matrix of the anisotropically electroconductive elastic connector sheet has a type A hardness specified in JIS K 6301 in the range from 20° H to 60° H.

3. The socket for inspection of a semiconductor device as claimed in claim 1 in which the contacting point of the contacting shoe of the lead frame has a roughened surface or a sharpened point so as to be able to scratch off the surface film on the surface contacted therewith.

4. The socket for inspection of a semiconductor device as claimed in claim 1 which further comprises a presser member mountable on the socket body to impart the leads of the semiconductor device mounted in the mounting seat of the socket body with a contacting load against the contacting shoes of the lead frame.

5. The socket for inspection of a semiconductor as claimed in claim 1, wherein the precious metal plated contacting surface of the shoe comprises a gold plating layer having a thickness of from about 0.03 $\mu$m to about 1.0 $\mu$m.

6. The socket for inspection of a semiconductor as claimed in claim 1, wherein the precious metal plated contacting surface of the shoe comprises a gold plating layer having a thickness of from about 0.03 $\mu$m to about 1.0 $\mu$m formed on an underplating layer of nickel having a thickness of from about 2 $\mu$m to about 6 $\mu$m.

\* \* \* \* \*